United States Patent
Firmin

(10) Patent No.: US 6,181,133 B1
(45) Date of Patent: Jan. 30, 2001

(54) MAGNETIC RESONANCE IMAGING OF FLUID FLOWS USING ECHO-PLANAR TECHNOLOGY

(75) Inventor: David Firmin, London (GB)

(73) Assignee: Royal Brompton Hospital, London (GB)

(*) Notice: Under 35 U.S.C. 154(b), the term of this patent shall be extended for 0 days.

(21) Appl. No.: 09/064,881

(22) Filed: Apr. 23, 1998

Related U.S. Application Data

(63) Continuation-in-part of application No. 08/779,017, filed on Jan. 6, 1997, now abandoned.

(51) Int. Cl.$^7$ .................................................. G01V 3/00
(52) U.S. Cl. ........................................ 324/306; 324/309
(58) Field of Search .................................. 324/306, 307, 324/309, 312, 314, 300

(56) References Cited

U.S. PATENT DOCUMENTS

| | | | |
|---|---|---|---|
| 4,570,119 | * | 2/1986 | Wehrli et al. ........................ 324/306 |
| 5,329,925 | * | 7/1994 | NessAiver ............................ 324/306 |
| 5,394,872 | * | 3/1995 | Takiguchi et al. .................... 324/309 |
| 5,926,022 | | 7/1999 | Slavin et al. ......................... 324/309 |
| 5,957,843 | * | 9/1999 | Luk Pat et al. ....................... 324/309 |

* cited by examiner

Primary Examiner—Louis Arana
(74) Attorney, Agent, or Firm—Dykema Gossett PLLC

(57) ABSTRACT

A method of magnetic resonance imaging a flowing liquid flowing through a rectangular cross-section column of space, wherein imaging readings are obtained from points throughout the column by utilizing a frequency encoding gradient to define the position of a reading point in the direction of the long axis of the column; defining the position of a reading point in a plane normal to the long axis of the column using one of phase encoding gradients and echo-planar blips; using one of phase encoding gradients and echo-planar blips with odd echoes and even echoes to acquire readings in two distinct regions of k-space; and obtaining readings in each plane normal to the long axis of the column from a 32×32 matrix of reading points using 16 phase encoding steps and 8 echo planar interleaves. Alternatively, the step of obtaining may be accomplished by varying the velocity phase sensitivity of the frequency encoding gradient to achieve a continuously varying phase sensitivity across k-space.

3 Claims, 5 Drawing Sheets

| | | | |
|---|---|---|---|
| (1, 1, 8) • | (1, 3, 8) • | (1, 5, 8) • | (1, 7, 8) • |
| (2, 1, 7) • | (2, 3, 7) • | (2, 5, 7) • | (2, 7, 7) • |
| (3, 1, 6) • | (3, 3, 6) • | (3, 5, 6) • | (3, 7, 6) • |
| (4, 1, 5) • | (4, 3, 5) • | (4, 5, 5) • | (4, 7, 5) • |
| (5, 1, 4) • | (5, 3, 4) • | (5, 5, 4) • | (5, 7, 4) • |
| (6, 1, 3) • | (6, 3, 3) • | (6, 5, 3) • | (6, 7, 3) • |
| (7, 1, 2) • | (7, 3, 2) • | (7, 5, 2) • | (7, 7, 2) • |
| (8, 1, 1) • | (8, 3, 1) • | (8, 5, 1) • | (8, 7, 1) • |
| (1, 2, 0) • | (1, 4, 0) • | (1, 6, 0) • | (1, 8, 0) • |
| (2, 2, -1) • | (2, 4, -1) • | (2, 6, -1) • | (2, 8, -1) • |
| (3, 2, -2) • | (3, 4, -2) • | (3, 6, -2) • | (3, 8, -2) • |
| (4, 2, -3) • | (4, 4, -3) • | (4, 6, -3) • | (4, 8, -3) • |
| (5, 2, -4) • | (5, 4, -4) • | (5, 6, -4) • | (5, 8, -4) • |
| (6, 2, -5) • | (6, 4, -5) • | (6, 6, -5) • | (6, 8, -5) • |
| (7, 2, -6) • | (7, 4, -6) • | (7, 6, -6) • | (7, 8, -6) • |
| (8, 2, -7) • | (8, 4, -7) • | (8, 6, -7) • | (8, 8, -7) • |

*Fig.2*

MAGNETIC RESONANCE IMAGING OF FLUID FLOWS USING ECHO-PLANAR TECHNOLOGY

RELATED APPLICATIONS

This application is a continuation-in-part of application Ser. No. 08/779,017, filed Jan. 6, 1997 and now abandoned.

BACKGROUND OF THE INVENTION

1. Field of the Invention

The present invention relates to magnetic resonance imaging, and in particular to the application of this technique to acquiring information about flowing liquids, in particular flowing blood in a live patient.

This invention can be used in conjunction with one, some or all of the inventions described in the following patent applications all assigned to the same assignee as the present application and filed Jan. 6, 1997: (1) U.S. Ser. No. 08/779,020 and entitled Magnetic Field Measurement; (2) U.S. Ser. No. 08/779,021 and entitled Radio Frequency Coil Switching; (3) U.S. Ser. No. 08/779,016 and entitled Phase-Error Correction in Magnetic Resonance Machines, now abandoned; and (4) U.S. Ser. No. 08/779,018 and entitled Gradient Coils in Magnetic Resonance Imaging Machines.

2. The Prior Art

The principles behind magnetic resonance imaging have been described in many publications, for instance "The Principles of Magnetic Resonance" by D. B. Lougmore, British Medical Bulletin (1989), Vol.45, No.4, pages 848 to 880. In general terms, the imaging is conducted by the excitation of hydrogen nuclei in a subject to be studied, the subject being positioned in a magnetic field and the excitation being carried out by a radio frequency energy field. The hydrogen nuclei resonate at frequencies according to the strength of the magnetic field in which they are located, and from these resonances it is possible to build up a three dimensional picture of the subject under consideration.

More particularly, a fixed very strong magnetic field is provided, upon which are super-imposed gradient magnetic fields generated by electromagnets known as gradient coils, and by proper control of these coils it is possible to control the magnetic fields at points across the image volume. As is known, these gradient fields can be controlled to change very fast.

The "raw data" obtained from the imaging machine is data concerning the frequencies of the resonances referred to above, and, mathematically, this data is considered to be in the frequency domain, or k-space. Again, as is well known such data can be transformed using Fourier transforms to give the spatial representation of the data which is the final image.

More recently, a number of methods have been developed for quantitatively studying flow, for instance blood flow in a heart during the heart cycle, by use of magnetic resonance imaging. In order to obtain a complete picture of such blood flow it is necessary to obtain information in seven dimensions, that is 3 spatial, 3 velocity and 1 time dimension. Obtaining such high quantities of information can mean that the overall imaging process is impracticably long.

In general therefore, time limitations have meant that various compromises have had to be made when such flow information is required. One option which has been pursued is to remove at least one dimension of information in order to study the other dimensions fully.

In an article, "Rapid 7-Dimensional Imaging of Pulsatile Flow" by D. N. Firmin et al published in the Proceedings of the Symposium on Computers in Cardiology, London, IEEE, September 1993, a particular method of 7-d imaging has been described. In this method the data acquisition time was reduced by restricting the field of interest to a particular rectangular cross section column of the imaging space. It is possible to do this without loss of important flow information because blood flow regions of interest are normally relatively small. Even if the flow patterns within the heart chambers are to be studied, the maximum spatial dimension of interest is usually only a few centimetres.

In the above mentioned method known techniques are used to selectively excite the selected column and different known types of imaging are used to cover the total image volume. In particular a frequency encoding gradient was used to move along the long axis of the column, while a limited number of phase encoding steps are used across the short axes of the column. Phase velocity mapping is used to quantify velocities in the 3 dimensions. These various phase techniques are well known in the art of magnetic resonance imaging, and further details of these can be found in the above mentioned article and the articles referred to therein.

While the method referred to above was a considerable improvement on the previous techniques it could still take up to 30 minutes to acquire a complete set of the required data, and it will be appreciated that since such studies are carried out on live patients, further reduction of the data acquisition time is desirable and advantageous.

SUMMARY OF THE INVENTION

The method according to the present invention is similar to that described above in that it is a method of studying a selectively excited rectangular cross section column. However, while in the above mentioned method a number of phase encoding steps are used to spatially resolve across the short axes of the column, in the present invention a technique known as echo-planar imaging is used across these dimensions. This imaging technique in itself is well known, and can be considered to be a method of obtaining a number of phase encoding results after a single radio frequency excitation.

There are however problems associated with the use of echo-planar imaging for obtaining blood flow information, in particular because this technique is very sensitive to flow which causes phase errors between odd and even echoes. In particular blood flow in the direction of the frequency encoding gradient causes odd and even echoes to have different phase errors.

According to the present invention the particular gradient fields which are applied during data acquisition are controlled such that the odd and even echoes in the echo-planar imaging technique are used to acquire the data for two distinct halves of k-space. This means that the phase errors within each half of k-space are constant.

The use of the echo-planar sequencing to conduct the imaging provides the advantage of reducing the acquisition time for the data by a factor of up to 8 or more, and according to the specific implementation of this invention, flow related image artifacts are overcome by the modification of the k-space coverage and flow phase sensitivity.

DESCRIPTION OF THE DRAWINGS

The above objects, features and advantages of the invention are believed to be readily apparent from a consideration of the following description of a preferred embodiment of the best mode of carrying out the invention, when taken in conjunction with the following drawings, wherein:

FIG. 2 shows a representation of the k-space coverage in the preferred embodiment of this invention;

DESCRIPTION OF THE PREFERRED EMBODIMENT

Figure 1:
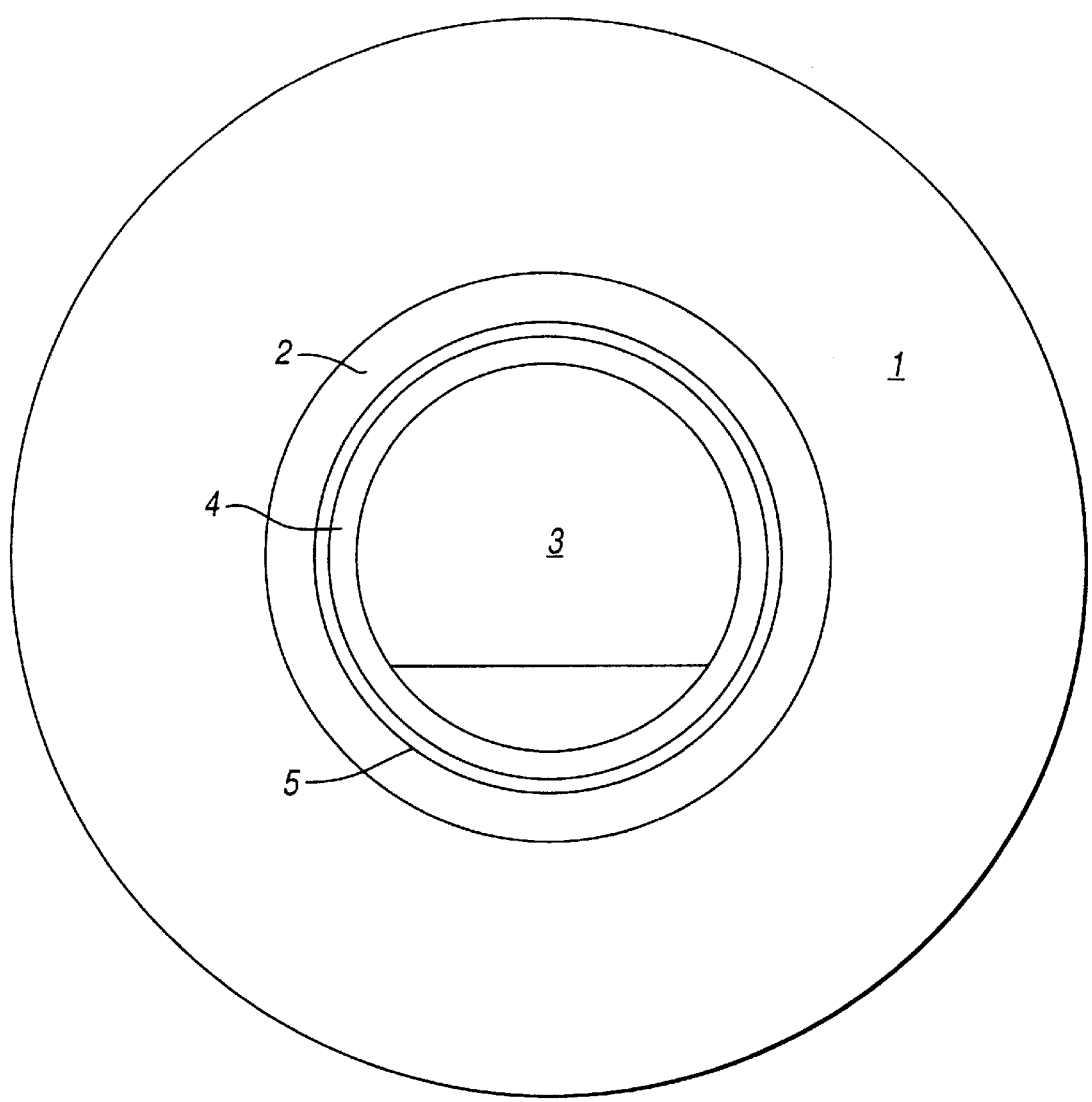
FIG. 1 is a schematic cross-sectional illustration of the principal components of MRI scanning apparatus.

MRI scanning apparatus is generally cylindrical in shape and is illustrated in cross-section in FIG. 1. The basic strong magnetic field is provided by a superconducting magnet I which is arranged to provide a very strong magnetic field in the region of the subject to be scanned. Typically this is achieved by providing a superconducting electro-magnet, having its windings immersed in liquid helium to maintain a very low temperature. Within the magnet I are located gradient coils indicated at 2. These gradient coils superimpose magnetic field gradients on the magnetic field generated by the magnet 1 so as to provide the varying fields required by the scanning process.

In the center of the apparatus is the imaging volume 3 into which the subject, for instance the patient, is positioned during scanning. Surrounding this space are radio frequency (RF) transmitter coils shown by 4 which are used to generate the RF energy used in the imaging process. Resonances generated in the subject are received by RF receiver coils (not shown) which are typically positioned close to the patient. Finally, between the RE transmitter coils 4 and the gradient coils 2 is an RF shield 5. The purpose of this is to ensure that the subject under consideration and the RE coils are in an isolated RF environment, i.e. the only RE signals within the volume 3 are those generated by the transmitter coils and induced in the subject under consideration and the signals do not leak out and interfere with the operation of the gradient coils.

The gradient coils and the RE transmitter coils are energized in known ways to effect the required imaging techniques, such as those mentioned above and utilized in this invention.

The invention has been implemented on a 0.5 Tesla whole body system such as that illustrated in FIG. 1 with an actively shielded gradient set enabling a maximum gradient strength of 20 mT/m and a slew rate of 60 T/m/s. A quadrature birdcage transmit coil was used with a surface receiver coil. A Surrey Medical Imaging Systems (SMIS) console, with additional hardware and software, was used to drive the sequences and acquire and reconstruct the data.

2-D selective excitation pulses were designed in order to excite square or rectangular cross section columns within the imaging volume. An 8 echo, echo-planar sequence with 256 samples per echo was used to acquire the data. Coverage of the 3-D k-space was achieved by use of a frequency encoding gradient to move along the long axis with phase encoding gradients or echo-planar blips to move along the short axes of the column.

The problems of artifacts on echo planar images that result because of the alternating phase shifts due to flow in the direction of the frequency encoding gradient are removed according to the invention by applying phase encoding blips in such a way that the odd and the even echoes are used to acquire two distinct halves of k-space. The frequency encoding gradient's velocity phase sensitivity for each separate sequence repetition and phase encoding was adjusted to give a continuously varying phase sensitivity through k-space so that there was no sudden step in phase sensitivity between the two halves.

FIG. 2 shows an arrangement for the short axes of k-space with the numbers in parenthesis indicating the phase encoding step number, the echo number and a number related to the velocity phase sensitivity in the frequency encoding direction respectively.

In order to acquire a 32×32 short axis matrix, 16 phase encoding steps and 8 echo-planar interleaves were required. Appropriate time shifting of the frequency encoding gradient waveforms were applied in order to avoid magnitude and phase discontinuities between interleaves.

The problems of flow related signal loss were minimized by offsetting the center of k-space to the 2nd echo and velocity compensating all axes at the time of the center of k-space. Velocity encoding in all three directions was achieved in the conventional way. By reducing the rf flip angle the sequence could be repeated with a minimum TR of 30 ms thus enabling an adequate temporal resolution to study pulsatile flow throughout the cardiac cycle. The typical acquisition times of a 32×32×256 image with 3 velocity dimensions and one time dimension enabling a complete study of the details of flow throughout the cardiac cycle was of the order of 8 minutes.

The image reconstruction was carried out using an i860 processor card with 128 Mbytes of memory. If 16 frames are acquired per cardiac cycle, a total of 1536 32×256 velocity images are reconstructed. These are arranged with the x, y and z velocity images stacked onto one image so that a cine can be displayed of flow throughout the cardiac cycle in one slice or flow throughout the 32 slices at one time in the cardiac cycle.

The technique was tested on flow phantoms and compared with sequences where the echo-planar data were acquired in a more conventional manner and without the continuously varying velocity sensitivity. The technique was also tested in vivo to study flow patterns in the cardiac chambers throughout the cardiac cycle.

DESCRIPTION OF SHORT AXIS-SPACE COVERAGE

Figure 3A:
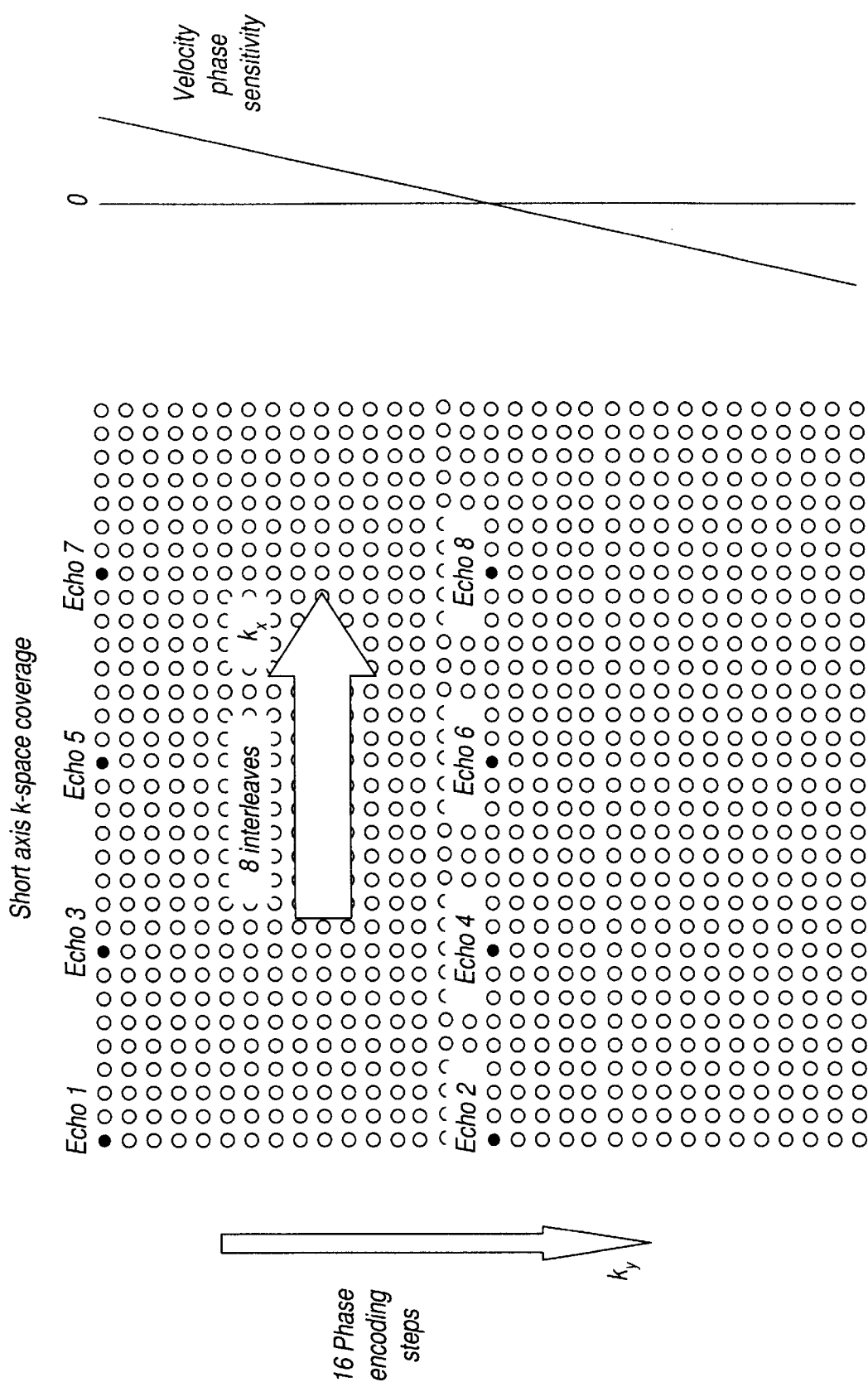
FIG. 3(a) illustrates the short axis coverage of k-space.
Figure 3B:
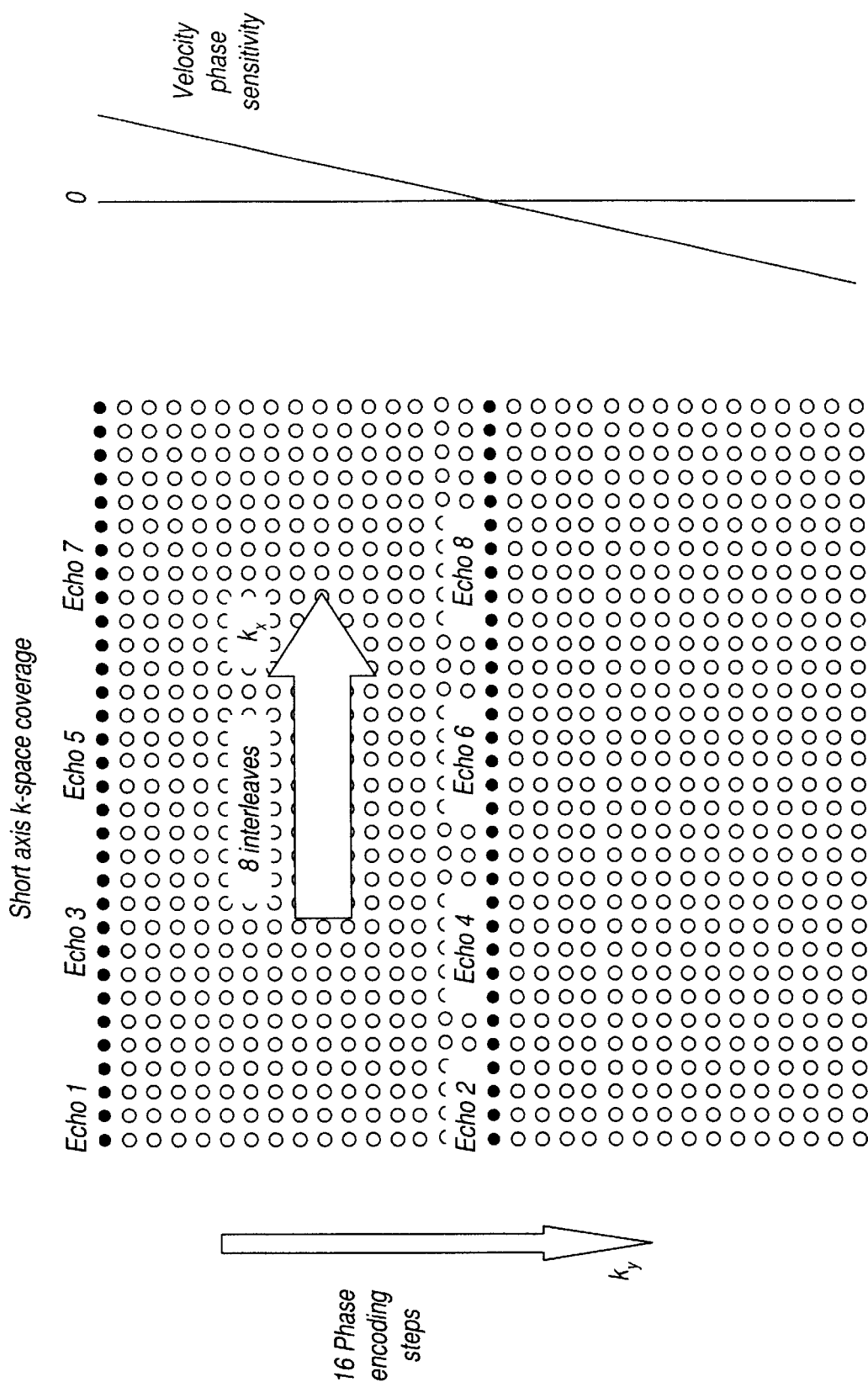
FIG. 3(b) illustrates the acquired k-space (solid dots) after the first 8 interleaves.

The short axis of k-space is sampled by repeating the 8 echo echo-planar sequence. The short axis coverage of k-space is as illustrated in FIG. 3(a). The 8 solid dots, respectively represented by Echo 1 through Echo 8, are acquired with the first echo-train acquisition. This is repeated for the 8 interleaves by adding an incremental $k_x$ phase encoding before the echo train is acquired. FIG. 3(b) illustrates the acquired k-space (solid dots), again respectively identified as Echo 1 through Echo 8, after the first 8 interleaves.

The above process is repeated for the 16 encoding steps by adding an incremental $k_y$ phase encoding before the echo train is acquired.

Figure 3C:
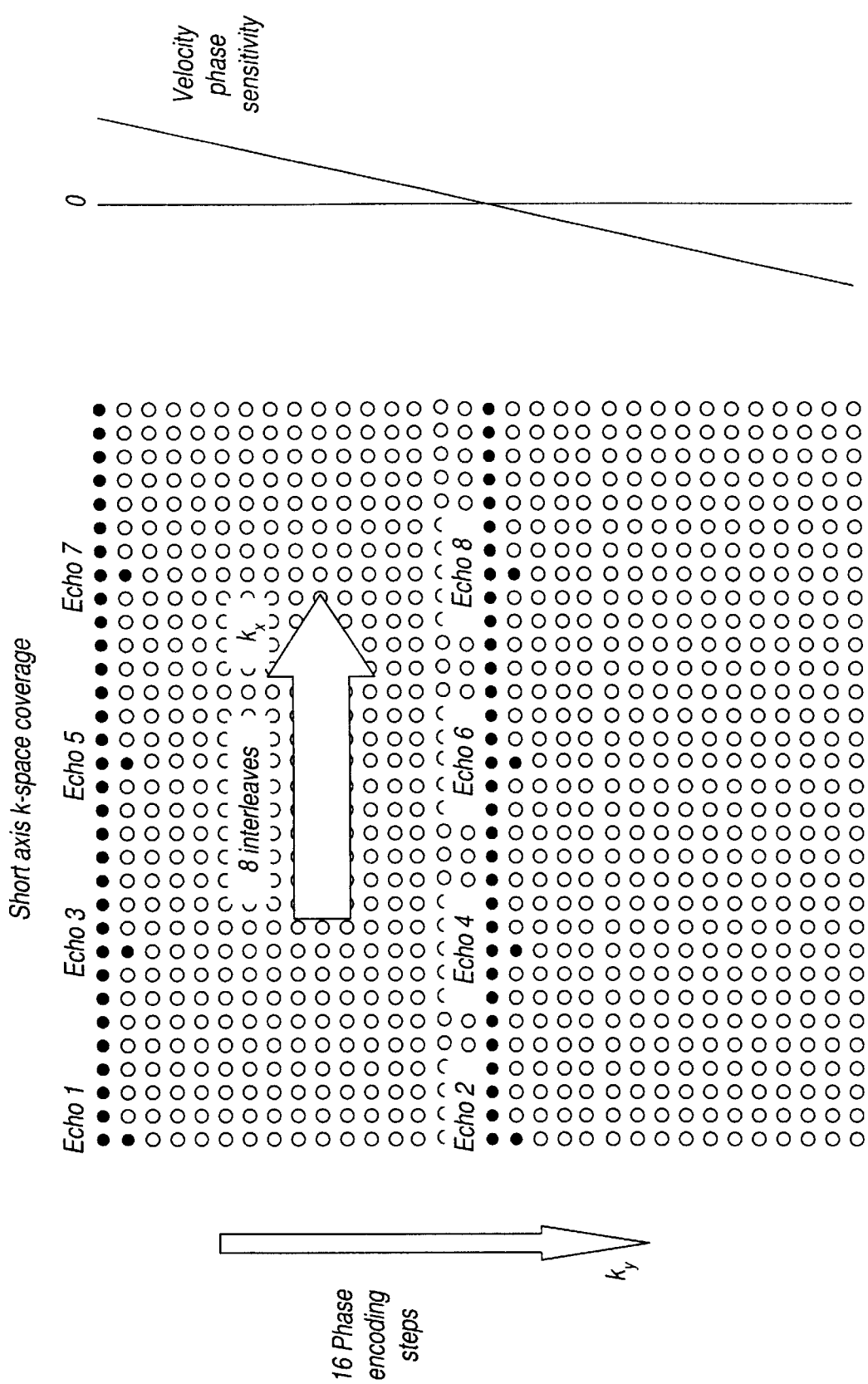
FIG. 3(c) illustrates the acquired k-space (solid dots) after the first interleave of the second phase encoding has been acquired.

FIG. 3(c) illustrates the acquired k-space (solid dots) and identified respectively as Echo 1 through Echo 8, after the first interleave of the second phase encoding has been acquired. A unique velocity phase encoding is applied in the z axis before the acquisition of each different phase encoding step. This velocity phase encoding is calculated for each of the 16 phase encoding steps, to produce a continuous smoothly changing z direction velocity phase sensitivity as the encoding moves through k-space in the $k_y$ direction. Without the velocity plus the encoding there would be a discontinuity between the odd echoes at the top and the even echoes at the bottom of k-space in the $k_y$ direction.

The above description is for the acquisitions of a 32×32 short axis k-space matrix. However, other matrix sizes would be possible by adjustment of the numbers of interleaves and phase encoding steps.

SUMMARY

Comparing the technique of the invention with methods using more conventional echo-planar and methods without the continuously varying velocity sensitivity, clearly showed a significant reduction in ghost artifacts caused by flow.

The flow phantom studies displayed flow patterns similar to those predicted by theoretical fluid dynamics.

In vivo studies on normal subjects demonstrate the potential of studying flow patterns throughout the cardiac cycle with minimal problems of flow related signal loss.

This invention enables a more complete study of blood flow physiology in an acceptable scan time.

What is claimed is:

1. A method of magnetic resonance imaging a flowing liquid flowing through a column of space having a long axis, comprising the steps of:

obtaining imaging readings from reading points throughout said column by utilizing a frequency encoding gradient to define the position of a reading point in the direction of the long axis of said column; and defining the position of a reading point in a plane normal to the long axis of the column using phase encoding gradients and echo-planar blips;

wherein eco-planar blips with odd echoes and even echoes are used to acquire readings in two distinct regions of k-space while the velocity phase sensitivity of said frequency encoding gradient is adjusted to ensure phase continuity between said regions of k-space; and obtaining readings in each plane normal to the long axis of the column from a matrix of reading points using a plurality of phase encoding steps and a plurality of echo interleaves.

2. A method of magnetic resonance according to claim 1, wherein the step of obtaining readings further comprises acquiring eight points with a first echo-train acquisition; repeating the aforesaid acquisition for 8 interleaves by adding an incremental $k_x$ phase encoding before acquiring the echo train; repeating the aforesaid acquiring steps for 16 phase encoding steps by adding an incremental $k_y$ phase encoding before the echo train is acquired; and applying a velocity phase encoding to the long axis of the column before the acquisition of each different phase encoding step.

3. A method of magnetic resonance imaging a flowing liquid flowing through a column of space having a long axis, comprising the steps of:

obtaining imaging readings from reading points throughout said column by utilizing a frequency encoding gradient to define the position of a reading point in the direction of the long axis of said column; and defining the position of a reading point in a plane normal to the long axis of the column using phase encoding gradients and echo-planar blips;

wherein echo-planar blips with odd echoes and even echoes are used to acquire readings in two distinct regions of k-space; and the velocity phase sensitivity of said frequency encoding gradient is varied to achieve a continuously varying phase sensitivity across k-space.

* * * * *